(12) United States Patent
Stowell et al.

(10) Patent No.: US 6,635,124 B1
(45) Date of Patent: Oct. 21, 2003

(54) METHOD OF DEPOSITING A THERMAL BARRIER COATING

(75) Inventors: William Randolph Stowell, Rising Sun, IN (US); Bangalore Nagaraj, West Chester, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/064,926

(22) Filed: Aug. 29, 2002

(51) Int. Cl.$^7$ ................................. C23C 8/80
(52) U.S. Cl. ............ 148/277; 148/280; 148/281; 148/284; 148/518; 204/192.11; 204/192.12; 427/530; 427/528; 427/539
(58) Field of Search ............... 148/277, 280, 148/281, 284, 518; 505/731; 204/192.11, 192.12; 427/530, 528, 539

(56) References Cited

U.S. PATENT DOCUMENTS

| | | | | |
|---|---|---|---|---|
| 5,849,162 A | * | 12/1998 | Bartolomei et al. | ... 204/192.13 |
| 5,876,860 A | * | 3/1999 | Marijnissen et al. | ........ 428/623 |
| 6,042,898 A | * | 3/2000 | Burns et al. | ................ 427/534 |

* cited by examiner

Primary Examiner—John Sheehan
Assistant Examiner—Andrew L. Oltmans
(74) Attorney, Agent, or Firm—David L. Narciso; Gary M. Hartman; Domenica N. S. Hartman

(57) ABSTRACT

A process of forming a ceramic coating on a component. The process generally entails placing the component in a coating chamber containing oxygen and an inert gas, heating a surface of the component to a temperature of about 100 to about 150° C., and then generating a metal vapor from at least one metal target using a microwave-stimulated, oxygen-containing sputtering technique. The metal vapor is then caused to condense on the component surface to form a metal layer, after which the metal layer is treated with a microwave-stimulated plasma to oxidize the metal layer and form an oxide layer having a columnar microstructure. The generating, condensing and treating steps can be repeated any number of times to form multiple oxide layers that together constitute the ceramic coating.

20 Claims, 1 Drawing Sheet

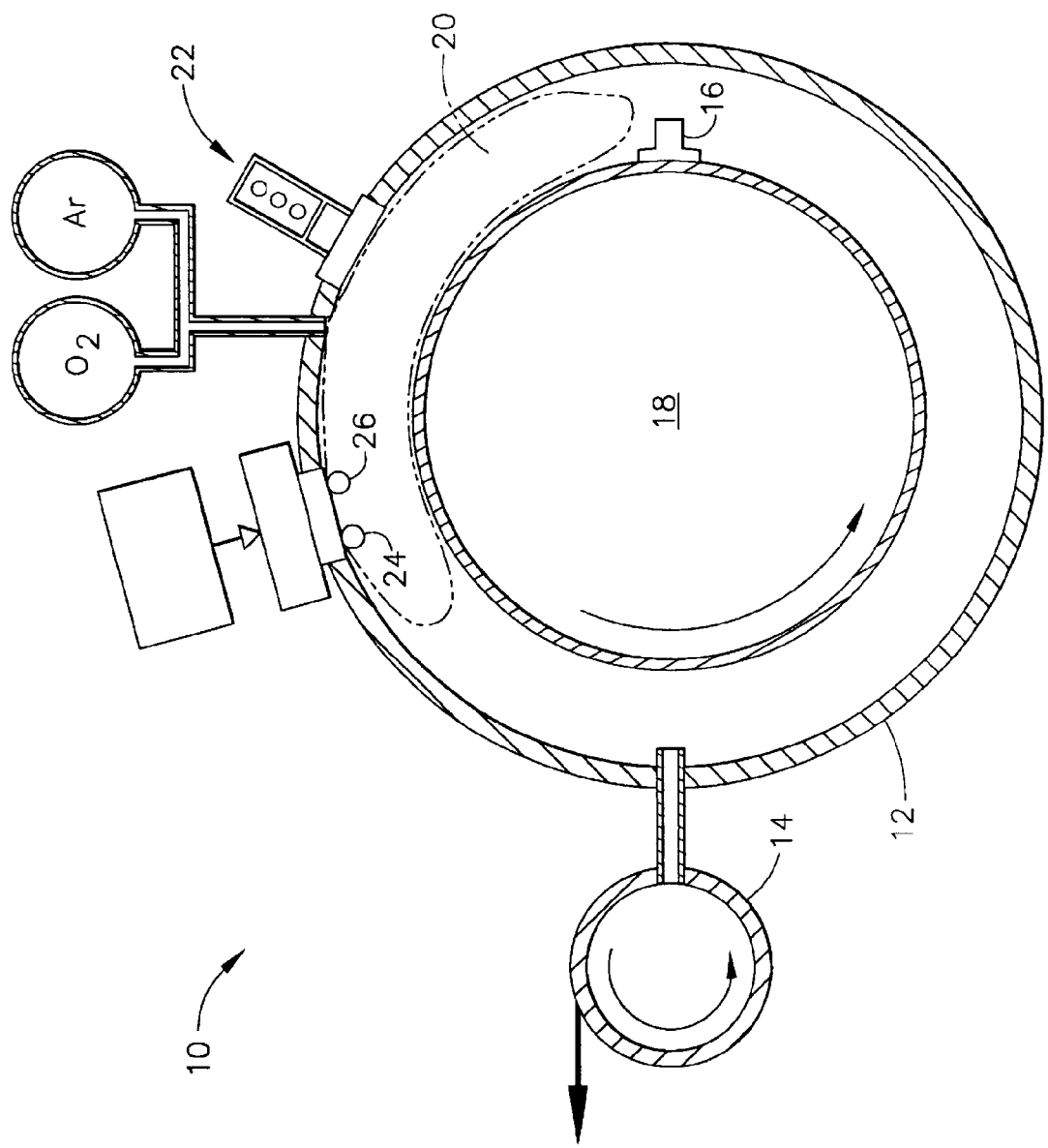

METHOD OF DEPOSITING A THERMAL BARRIER COATING

BACKGROUND OF INVENTION

1. Field of the Invention

The present invention generally relates to thermal-insulating ceramic coatings for components exposed to high temperatures, such as the hostile thermal environment of a gas turbine engine. More particularly, this invention is directed to a deposition process that can be performed at relatively low surface temperatures to form a thermal barrier coating that exhibits improved resistance to spallation.

2. Description of the Related Art

Components within the hot gas path of a gas turbine engine are often protected by a thermal barrier coating (TBC) system. TBC systems include a thermal-insulating ceramic topcoat, typically referred to as the TBC, which is typically bonded to the component with an environmentally-protective bond coat. Bond coat materials widely used in TBC systems include overlay coatings such as MCrAlX (where M is iron, cobalt and/or nickel, and X is yttrium or another rare earth or reactive element such as hafnium, zirconium, etc.), and diffusion coatings such as diffusion aluminides, notable examples of which are NiAl and NiAl (Pt). Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques.

To be effective, TBC's must have low thermal conductivity, strongly adhere to the surface it protects, and remain adherent through many heating and cooling cycles. The latter requirement is particularly demanding due to the different coefficients of thermal expansion between materials having low thermal conductivity and superalloy materials typically used to form turbine engine components. For this reason, various coating systems have been proposed in which the TBC has enhanced strain tolerance as a result of the presence of porosity, microcracks and/or segmentation of the ceramic layer. Segmentation indicates that the ceramic layer has columnar grain boundaries or cracks oriented perpendicular to the surface of the component, such as that achieved with PVD processes such as electron beam physical vapor deposition (EBPVD). As is known in the art, a TBC having a columnar grain structure is able to expand with its underlying substrate without causing damaging stresses that lead to spallation. As a result, TBC's employed in the highest temperature regions of gas turbine engines are often deposited by EBPVD. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

EBPVD coaters, which typically require substrate temperatures in the range of throughput, and are therefore used in the production of gas turbine engine components. However, EBPVD coaters are relatively expensive and typically have long lead times for delivery as compared to other deposition equipment. Therefore, EBPVD coaters are not well suited for use in coating operations in which a relatively small number of components are to be processed, such as in the repair of gas turbine engine airfoils. While other PVD processes such as sputtering can be performed with equipment that costs much less than EBPVD coaters, and have capacities better matched to repair operations, sputtering technologies generally require hundreds of hours of deposition time to apply YSZ in thicknesses (e.g., about 125 micrometers) typically required for airfoils.

SUMMARY OF INVENTION

The present invention is a process for forming a ceramic coating on a component, such as a gas turbine engine component that will be subjected to a hostile environment. The coating has a columnar grain structure and is deposited by a reactive sputtering technique that significantly improves throughput, produces a coating with improved spallation resistance, and can be performed with an apparatus that can be significantly lower in cost than EBPVD equipment.

The process of this invention generally entails placing the component intended for coating in a chamber containing oxygen and an inert gas, heating a surface of the component to a temperature of about 50° C. to about 400° C., and then generating a metal vapor from at least one metal target using a microwave-stimulated, oxygen-containing sputtering technique. The metal vapor is then caused to condense on the component surface to form a metal layer, after which the metal layer is treated with a microwave-stimulated plasma to at least partially oxidize the metal layer and form an oxide layer having a columnar microstructure. The generating, condensing and treating steps can be repeated any number of times to form multiple oxide layers that together constitute the ceramic coating.

According to one aspect of the invention, the ceramic coating is almost fully substoichiometric zirconia as a result of using one or more zirconium-containing metal targets and the diffusion-limited oxidation reaction caused by the microwave-stimulated plasma. According to another aspect of the invention, if zirconium targets are used, a spall-resistant coating can be achieved with a coating consisting essentially of nonstabilized substoichiometric zirconia. Alternatively, one or more metal targets may consist of zirconium, yttrium, and incidental impurities, such that the ceramic coating consists essentially of zirconia at least partially stabilized by yttria, either or both of which are substoichiometric. According to yet another aspect of the invention, an yttrium metal layer can be deposited and at least partially oxidized in the same manner as and prior to the oxide layer, yielding an yttria layer on which the oxide layer is subsequently formed. According to one aspect of the invention, the ceramic coating is almost fully substoichiometric zirconia as a result of using one or more zirconium-containing metal targets and the diffusion-limited oxidation reaction caused by the microwave-stimulated plasma. According to another aspect of the invention, if zirconium targets are used, a spall-resistant coating can be achieved with a coating consisting essentially of nonstabilized substoichiometric zirconia. Alternatively, one or more metal targets may consist of zirconium, yttrium, and incidental impurities, such that the ceramic coating consists essentially of zirconia at least partially stabilized by yttria, either or both of which are substoichiometric. According to yet another aspect of the invention, an yttrium metal layer can be deposited and at least partially oxidized in the same manner as and prior to the oxide layer, yielding an yttria layer on which the oxide layer is subsequently formed.

Metal oxide coatings deposited in accordance with this invention have been determined to be significantly more spall resistant than coatings of the same materials deposited by EBPVD under conventional conditions. In addition, the coating deposition rate is significantly higher than conventional sputtering techniques. For example, an yttria-stabilized zirconia (YSZ) coating can be deposited with this process to a thickness of about 125 micrometers in approximately twenty hours by using multiple targets, and approximately eighty hours using a single target. In comparison, several hundred hours are required to deposit equivalent coatings using conventional sputtering techniques. Accordingly, the process of this present invention not only improves the spallation resistance of the resulting coating, but also significantly improves manufacturing economies, particularly for relatively low-volume coating repair operations. Another advantage of the sputtering process of this invention is that sputtering equipment can be purchased at lower cost and delivered and installed in a time frame shorter than that for EBPVD equipment.

Other objects and advantages of this invention will be better appreciated from the following detailed description.

BRIEF DESCRIPTION OF DRAWINGS

FIG. 1 schematically represents an apparatus for carrying out magnetron sputtering followed by microwave plasma oxidation to deposit a ceramic coating in accordance with this invention.

DETAILED DESCRIPTION

The present invention is generally directed to a process of depositing a ceramic coating, and particularly a thermal barrier coating (TBC) on a component intended for operation within an environment characterized by high temperatures. Notable examples of such components include the high and low pressure turbine nozzles and blades, shrouds, combustor liners and augmentor hardware of gas turbine engines. While the advantages of this invention will be described with reference to turbine blades of gas turbine engines, the teachings of this invention are generally applicable to any component in which a TBC can be used to insulate the component from a hostile thermal environment.

To illustrate the invention, the coating chamber 12 of a sputtering apparatus 10 is schematically represented in FIG. 1. Shown supported within the coating chamber 12 is a turbine blade 16 of a gas turbine engine. Coating chambers of the type shown in FIG. 1 are typically operated at a vacuum level of about 0.0001 to about 0.01 mbar. A vacuum pump 14 of a type known in the art is employed to evacuate the chamber 12 during the deposition process.

As is generally conventional, the blade 16 may be formed of a nickel, cobalt or iron-base superalloy, though other materials are also possible. The blade 16 has an airfoil section against which hot combustion gases are directed during operation of the gas turbine engine, and whose surfaces are therefore subjected to a hostile thermal and chemical environment. For this reason, it is desirable to deposit an adherent TBC system on the surfaces of the blade 16 to protect its substrate. As is generally typical in the art, the coating system is preferably composed of a metallic bond coat over which a ceramic TBC is deposited. The bond coat is preferably an oxidation-resistant metal composition that protects the underlying superalloy substrate from oxidation and enables the TBC to more tenaciously adhere to the substrate. Suitable bond coat materials include diffusion aluminide coatings containing intermetallic platinum and/or nickel aluminide phases, and MCrAlX overcoat alloys such as NiCrAlY.

Following deposition of the bond coat, the surface of the bond coat is preferably prepared for deposition of the TBC by grit blasting. Thereafter, an alumina scale is formed on the bond coat at an elevated temperature to promote adhesion of the TBC. The alumina scale, referred to as a thermally grown oxide (TGO), grows as a result of oxidation of the aluminum-containing bond coat. The alumina scale can be grown either through exposure to elevated temperatures during deposition of the TBC, or by way of a high temperature treatment specifically performed for this purpose. In FIG. 1, the blade 16 can be preheated within the coating chamber 12 or a separate preheat chamber (not shown) for a duration sufficient to develop an alumina scale. The preheat step also serves to bring the surface of the blade 16 to a temperature suitable for performing the coating process. While conventional EBPVD processes have typically employed temperatures of about 950° C. or more, the sputtering operation of this invention can be performed at much lower temperatures, such as about 50° C. to about 400° C., preferably about 100° C. to about 150° C. Advantages of using lower temperatures include improved columnarity of the TBC grains and the ability to coat components with brazed joints without remelting the braze material, and coating blades with shot-peened dovetails without negating the desired effects of shot peening.

The process for depositing TBC in accordance with this invention generally entails suspending the blade 16 in the coating chamber 12 above one or more metal targets 24 and 26, which are subjected to sputtering to generate a vapor of metal atoms that condense on the surfaces of the blade 16 to form a metal coating. To carry out the deposition process, the coating chamber 12 is evacuated and then backfilled with a mixture of oxygen and an inert gas (such as argon) to maintain a pressure of about 0.0001 to about 0.01 mbar during the coating operation. The addition of oxygen is for the purpose of oxidizing the metal layer to form a metal oxide layer. Suitable ceramic materials for the TBC include zirconia ($ZrO_2$) at least partially stabilized yttria ($Y_2O_3$), i.e., YSZ, with an yttria content of about 3–20 weight percent being suitable. Alternatively, zirconia partially or fully stabilized with magnesia, ceria, calcia, scandia or other oxides could be used. In accordance with one aspect of the invention, unstabilized zirconia is also a suitable TBC material, as will be discussed in greater detail below. If YSZ is to be deposited, the metal targets 24 and 26 include separate zirconium and yttrium metal targets, or one or more zirconium-yttrium alloy targets.

As shown in FIG. 1, the blade 16 is preferably secured to a rotatable support 18 of a type known in the art, so that the blade 16 is rotated past the targets 24 and 26. A heater (not shown) may be provided above the blade 16 to provide additional heating as may be required to supplement the heat provided by the plasma and radiation from the surfaces of the targets 24 and 26. In this manner, the blade 16 is maintained at the desired deposition temperature, e.g., about 50° C. to about 400° C., more preferably about 100° C. to about 150° C.

According to the invention, the metal layer deposited on the blade 16 undergoes a diffusion-limited oxidation process performed with a microwave-stimulated plasma 20 containing charged particles of oxygen and the inert gas, e.g., oxygen and argon ions, contained in the chamber 12. The microwave-stimulated plasma 20 is generated by a magnetron 22. As known in the art, a magnetron uses electric fields to trap electrons, which in the present invention enhance the formation of ions for sputtering. The sputtering rate for a magnetron is about ten to fifty times greater than that of a plasma sputtering target without a magnetron or other enhancement. A preferred magnetron for producing the microwave-stimulated plasma 20 and the oxidation reaction process is the 4000 Series commercially available from Deposition Sciences, Inc. According to known practice, magnets (not shown) are arranged behind each of the targets 24 and 26 to create a magnetic trap for the charged ions in front of each target 24 and 26. The targets 24 and 26 are then held at a negative voltage to attract the ions toward to the targets 24 and 26, from which metal atoms are displaced when impacted by the ions. Also released from the target surfaces are electrons that are held in the magnetic trap, where their energy is used to form more oxygen and inert gas ions. The displaced metal atoms are not charged, and therefore are able to escape the magnetic trap and condense on the surfaces of the blade 16 to form a layer of the target metal. Deposition rates of about 200 to 300 angstroms per minute per target 24/26 are possible with this invention, which is an order of magnitude higher than that achieved when depositing zirconia using conventional sputtering techniques. In practice, deposition rates of at least 234 angstroms per minute per target 24/26 have been attained.

The sputtering operation is continued for a duration sufficient to deposit about 100 micrometers of metal, after which the coated surfaces of the blade 16 are oxidized with the microwave-stimulated oxygen ions. During this portion of the coating process, the magnetron is 22 operated at a power level sufficient to generate ions of the inert gas without displacing a significant amount of atoms from the targets 24 and 26, such that minimal coating of the blade 16 occurs. Biasing the blade 16 at an appropriate level causes the oxygen ions to be attracted to the blade surfaces, with the resulting high-energy bombardment at least partially converting the metal layer to an oxide layer while also removing microscopic surface contamination. The resulting oxide layer is characterized by columnar grains similar to that produced by EBPVD, such as the columnar YSZ disclosed in U.S. patent application Ser. No. 09/621,422 to Rigney et al., and U.S. patent application Ser. No. 09/765,228 to Rigney et al. According to one aspect of the invention, the oxidation of the metal layer is incomplete as a result of the oxidation reaction being diffusion-limited, such that the resulting oxide layer is substoichiometric. For example, if the metal targets 24 and 26 are formed of zirconium, the resulting zirconium metal layer is not fully converted to stoichiometric zirconia ($ZrO_2$), such that the reacted layer is predominantly substoichiometric zirconia, with an approximate formula of $ZrO_{1.8}$.

Following the oxidation cycle, the bias voltage applied to the blade 16 is preferably reduced, and the power to the magnetron 22 is increased to reinitiate deposition of coating on the blade 16. Following the oxidation cycle, the bias voltage applied to the blade 16 is preferably reduced, and the power to the magnetron 22 is increased to reinitiate deposition of coating on the blade 16.

During an investigation leading to the present invention, test specimens formed of Ren é N5 superalloy (nominal composition in weight percent: 7.5Co, 7.0Cr, 1.5Mo, 5.0W, 3.0Re, 6.5Ta, 6.2Al, 0.15Hf, 0.05C, 0.004B, 0.01Y, balance Ni) were processed to have PtAl bond coats by platinum plating followed by vapor phase aluminizing. The specimens were then coated with about 100 micrometers of zirconia partially stabilized with about 7 weight percent yttria (7%YSZ) using the reactive sputtering process of this invention under the following conditions: coating (surface) temperature of about 100° C. to about 150° C. The specimens were rotated during deposition to improve the microstructure of the TBC. Furnace cycle testing (FCT) was then performed on the specimens at about 2125° F. (about 1160° C.) with forty-five minute cycles, with specimens being removed from test once 20% of the coating surface area had spalled. The specimens exhibited FCT lives of between 2× and 5× greater than a baseline average of 230 cycles for equivalent YSZ TBC deposited by EBPVD. Examination of the specimens showed that the TBC had strain-tolerant columnar grains similar in appearance to conventional YSZ TBC deposited by EBPVD.

The improved thermal cycle life exhibited by the specimens was concluded to be due to the reactive sputtering process, in which zirconium and yttrium atoms were deposited and then partially oxidized (i.e., each is substoichiometric), followed by additional layers of zirconium and yttrium metal that are also partially oxidized. It is believed the in-situ oxidation reaction produces a columnar microstructure similar to that of conventional EBPVD YSZ, but more porous. The increased porosity of the TBC was believed to better accommodate the mismatch between the coefficients of thermal expansion of the TBC and the underlying metallic bond coat and superalloy substrate.

In view of the above, an optional feature of the invention is a TBC formed of columnar substoichiometric zirconia that does not contain any stabilizer. It is believed that a columnar unstabilized zirconia TBC deposited by reactive sputtering in accordance with this invention can be sufficiently resistant to thermal cycle fatigue without the traditionally employed stabilizer. The advantages of such a TBC are simplicity and immunity from corrosion of yttria, which can occur when operating a gas turbine engine with vanadium-contaminated fuels.

Another optional feature of this invention is to deposit a thin layer of yttrium prior to depositing the first layer of stabilized or unstabilized zirconia (or other metal oxide ceramic material), using the same reactive sputtering process used to deposit the zirconia. Following treatment with the oxygen ion-containing plasma 20, the resulting yttria layer (which may further contain substoichiometric yttria and/or yttrium metal) will be incorporated into the alumina scale as the scale continues to grow at the bond coat/TBC interface during engine service. The yttria/yttrium can be expected to enhance the adhesion of the alumina scale by pegging and/or tying up trace amounts of sulfur, thereby increasing the life of the TBC.

While the invention has been described in terms of a preferred embodiment, it is apparent that other forms could be adopted by one skilled in the art. Accordingly, the scope of the invention is to be limited only by the following claims.

What is claimed is:

1. A process of forming a ceramic coating on a component, the process comprising the steps of:
   placing the component in a coating chamber containing oxygen and an inert gas;
   heating a surface of the component to a temperature of about 50° C. to about 400° C.;
   generating a metal vapor from at least one metal target using a microwave-stimulated, oxygen-containing sputtering technique;
   condensing the metal vapor on the surface to form a metal layer; and
   treating the metal layer with a microwave-stimulated plasma to at least partially oxidize the metal layer and form an oxide layer having a columnar microstructure.

2. A process according to claim 1, wherein the generating, condensing and treating steps are repeated to form multiple oxide layers that together constitute the ceramic coating.

3. A process according to claim 1, further comprising the step of forming a bond coat on the surface of the component prior to performing the generating, condensing and treating steps.

4. A process according to claim 1, wherein the metal target consists of zirconium and incidental impurities, and the ceramic coating consists essentially of nonstabilized zirconia.

5. A process according to claim 1, wherein the metal target contains zirconium and incidental impurities, and the ceramic coating contains substoichiometric zirconia.

6. A process according to claim 1, wherein the metal target consists of zirconium, yttrium, and incidental impurities.

7. A process according to claim 6, wherein the ceramic coating consists essentially of zirconia at least partially stabilized by yttria.

8. A process according to claim 6, wherein the ceramic coating is predominantly substoichiometric zirconia at least partially stabilized by substoichiometric yttria.

9. A process according to claim 1, further comprising the steps of, after the placing and heating steps but prior to the generating, condensing and treating steps:

generating an yttrium metal vapor from at least one yttrium-containing metal target using the microwave-stimulated, oxygen-containing sputtering technique;

condensing the yttrium metal vapor on the surface to form an yttrium metal layer; and treating the yttrium metal layer with a microwave-stimulated plasma to at least partially oxidize the yttrium metal layer and form an yttria layer on the surface;

wherein the oxide layer is subsequently formed on the yttria layer.

10. A process according to claim 1, wherein the metal target is evaporated at a rate of at least 200 angstroms per minute per metal target.

11. A process according to claim 1, wherein the component is an airfoil.

12. A process according to claim 1, wherein the component is a component of a gas turbine engine.

13. A process of forming a thermal barrier coating on a gas turbine engine component, the process comprising the steps of:

forming a bond coat on a surface of the component;

placing the component in a coating chamber containing oxygen and an inert gas;

heating a surface of the component to a temperature of about 100° C. to about 150° C.;

generating a metal vapor from multiple zirconium-containing metal targets using a microwave-stimulated, oxygen-containing sputtering apparatus;

condensing the metal vapor on the surface to form a metal layer; and treating the metal layer with a microwave-stimulated plasma to cause diffusion-limited oxidation of the metal layer and form a columnar oxide layer comprising substoichiometric zirconia;

wherein the generating, condensing and treating steps are repeated to form multiple oxide layers that together constitute the ceramic coating.

14. A process according to claim 13, wherein at least one of the multiple metal targets consists of zirconium and incidental impurities.

15. A process according to claim 14, wherein, the ceramic coating consists essentially of nonstabilized substoichiometric zirconia.

16. A process according to claim, 13, wherein at least one of the multiple metal targets consists of zirconium, yttrium, and incidental impurities.

17. A process according to claim 13, wherein the ceramic coating consists essentially of substoichiometric zirconia at least partially stabilized by substoichiometric yttria.

18. A process according to claim 13, further comprising the steps of, after the placing and heating steps but prior to the generating, condensing and treating steps:

generating an yttrium metal vapor from at least one yttrium-containing metal target using the microwave-stimulated, oxygen-containing sputtering technique;

condensing the yttrium metal vapor on the surface to form an yttrium metal layer; and treating the yttrium metal layer with a microwave-stimulated plasma to at least partially oxidize the yttrium metal layer and form an yttria layer on the surface;

wherein the oxide layer comprising zirconia is subsequently formed on the yttria layer.

19. A process according to claim 13, wherein each of the multiple metal targets is evaporated at a rate of at least about 234 angstroms per minute.

20. A process according to claim 13, wherein the component is an airfoil.

* * * * *